(12) United States Patent
Kuroda

(10) Patent No.: US 12,170,855 B2
(45) Date of Patent: *Dec. 17, 2024

(54) PHOTOELECTRIC CONVERSION APPARATUS AND IMAGING SYSTEM

(71) Applicant: CANON KABUSHIKI KAISHA, Tokyo (JP)

(72) Inventor: Yukihiro Kuroda, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/505,008

(22) Filed: Nov. 8, 2023

(65) Prior Publication Data

US 2024/0073561 A1    Feb. 29, 2024

Related U.S. Application Data

(63) Continuation of application No. 17/849,486, filed on Jun. 24, 2022, now Pat. No. 11,856,306, which is a continuation of application No. 17/015,729, filed on Sep. 9, 2020, now Pat. No. 11,418,743, which is a continuation of application No. 16/268,324, filed on Feb. 5, 2019, now Pat. No. 10,798,327.

(30) Foreign Application Priority Data

Feb. 9, 2018 (JP) .................... 2018-022023

(51) Int. Cl.
*H04N 25/709* (2023.01)
*H01L 27/146* (2006.01)
*H01L 31/107* (2006.01)
*H04N 25/772* (2023.01)
*H04N 25/773* (2023.01)
*H04N 25/79* (2023.01)
*H03K 5/01* (2006.01)
*H03K 21/38* (2006.01)

(52) U.S. Cl.
CPC ........ *H04N 25/709* (2023.01); *H01L 27/146* (2013.01); *H01L 27/14609* (2013.01); *H01L 27/14634* (2013.01); *H01L 31/107* (2013.01); *H04N 25/772* (2023.01); *H04N 25/773* (2023.01); *H04N 25/79* (2023.01); *H03K 5/01* (2013.01); *H03K 21/38* (2013.01)

(58) Field of Classification Search
CPC .. H04N 25/709; H04N 25/772; H04N 25/773; H04N 25/79; H01L 27/146; H01L 27/14609; H01L 27/14634; H01L 31/107
See application file for complete search history.

(56) References Cited

U.S. PATENT DOCUMENTS 10,798,327 B2 * 10/2020 Kuroda ................. H01L 27/146
11,418,743 B2 * 8/2022 Kuroda ................. H04N 25/79
11,856,306 B2 * 12/2023 Kuroda ............ H01L 27/14609
(Continued)

*Primary Examiner* — Daniel M Pasiewicz
(74) *Attorney, Agent, or Firm* — Canon U.S.A., Inc. I.P. Division

(57) ABSTRACT

A photoelectric conversion apparatus includes a pulse shaping circuit that shapes an output from a diode of avalanche amplification type into a pulse, and a pulse conversion circuit that converts a pulse signal output from the pulse shaping circuit. The pulse conversion circuit converts a pulse signal having a first amplitude and output from the pulse shaping circuit into a pulse signal having a second amplitude smaller than the first amplitude.

16 Claims, 15 Drawing Sheets

(56) References Cited

U.S. PATENT DOCUMENTS

2011/0266420 A1* 11/2011 Eldesouki ............. H01L 31/107
                                                                  250/214.1
2015/0115131 A1*  4/2015 Webster ............... H04N 25/772
                                                                  250/208.1

* cited by examiner

PHOTOELECTRIC CONVERSION APPARATUS AND IMAGING SYSTEM

CROSS-REFERENCE TO RELATED APPLICATION

This application is a Continuation of U.S. application Ser. No. 17/849,486, filed Jun. 24, 2022; which is a Continuation of U.S. application Ser. No. 17/015,729, filed Sep. 9, 2020, now U.S. patent Ser. No. 11/418,743, issued Aug. 16, 2022; which is a Continuation of U.S. application Ser. No. 16/268,324, filed Feb. 5, 2019, now U.S. Pat. No. 10,798,327, issued Oct. 6, 2020; which claims the benefit of Japanese Patent Application No. 2018-022023, filed Feb. 9, 2018, which is hereby incorporated by reference herein in its entirety.

BACKGROUND OF THE INVENTION

Field of the Invention

The present invention relates to a photoelectric conversion apparatus and an imaging system.

Description of the Related Art

There is known a photoelectric conversion apparatus that digitally counts the number of photons having been reached a photodiode and outputs a count value as a photoelectrically converted digital signal from a pixel. In terms of noise and signal arithmetic operation processing, the advantage of digitizing a pixel signal is large. United States Patent Application Publication No. 2015/0115131 discusses an imaging apparatus in which a plurality of pixels each of which outputs a photoelectrically converted digital signal is arrayed.

SUMMARY OF THE INVENTION

According to an aspect of the present invention, a photoelectric conversion apparatus includes a diode of avalanche amplification type, a pulse shaping circuit configured to shape an output of the diode into a pulse, a pulse conversion circuit configured to convert the pulse signal having a first amplitude into a pulse signal having a second amplitude that is smaller than the first amplitude, and a signal processing circuit configured to process the pulse signal having the second amplitude output from the pulse conversion circuit, wherein the diode is supplied with a first power supply voltage and a second power supply voltage, wherein the signal processing circuit is supplied with a third power supply voltage and a fourth power supply voltage, and wherein a difference between the first power supply voltage and the second power supply voltage is greater than a difference between the third power supply voltage and the fourth power supply voltage.

Further features of the present invention will become apparent from the following description of embodiments with reference to the attached drawings.

DESCRIPTION OF THE EMBODIMENTS

In United States Patent Application Publication No. 2015/0115131, a substrate for a photodiode unit and a substrate for a circuit unit are separately provided in a layered structure, whereby a higher degree of integration and a higher speed of a photoelectric conversion apparatus can be achieved. In the photoelectric conversion apparatus discussed in the description of United States Patent Application Publication No. 2015/0115131, high voltage power is used for the photodiode unit to utilize avalanche breakdown. Meanwhile, it is desirable to use low voltage power for the circuit unit, for a higher degree of integration and a higher speed. The description of United States Patent Application Publication No. 2015/0115131 however discusses nothing about an element configuration in a case where a plurality of power supply voltages is used.

Embodiments to be described below relate to a technology for providing a configuration desirable for a photoelectric conversion apparatus that includes a photoelectric conversion unit for outputting a digital signal and uses a plurality of power supply voltages.

Figure 1:
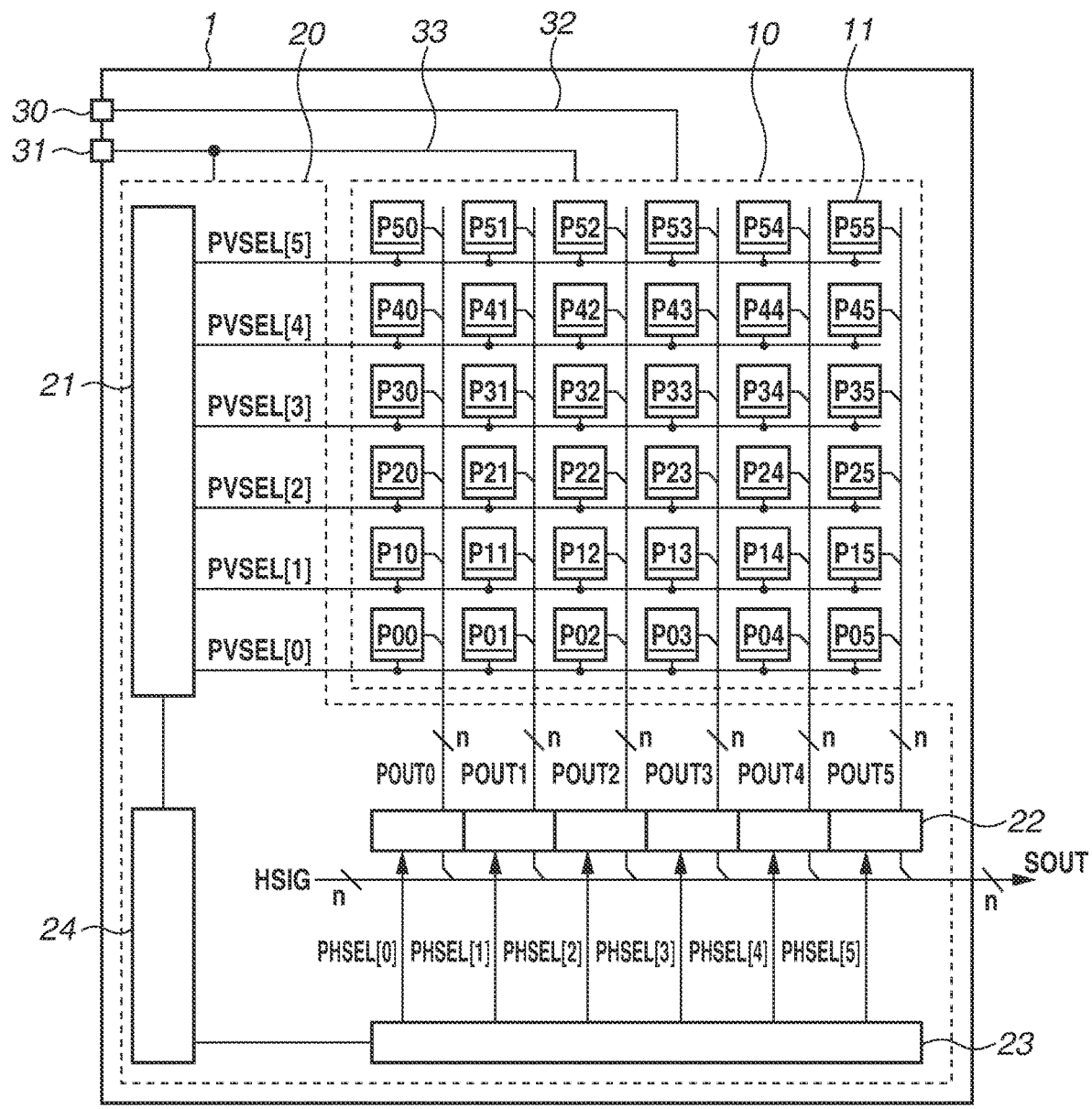
FIG. 1 is a configuration diagram illustrating a photoelectric conversion apparatus according to a first embodiment.

A photoelectric conversion apparatus according to a first embodiment is formed on a first semiconductor substrate 1 as illustrated in FIG. 1. This photoelectric conversion apparatus includes a sensor unit 10, a circuit unit 20, a first terminal 30, and a second terminal 31.

The first terminal 30 serves as a terminal for high voltage power (a voltage VDD1) that is supplied to a photodiode disposed in the sensor unit 10. The first terminal 30 is connected to the sensor unit 10 via a line 32.

The second terminal 31 serves as a terminal for low voltage power (a voltage VDD2) that is supplied to a pixel circuit disposed in the sensor unit 10 and to the circuit unit 20. The second terminal 31 is connected to the sensor unit 10 and the circuit unit 20 via a line 33.

The sensor unit 10 includes a plurality of unit pixels 11. Each of the unit pixels 11 outputs a signal in response to incidence of light. The plurality of unit pixels 11 is arranged in a matrix in the sensor unit 10. FIG. 1 illustrates a case where the unit pixels 11 indicated by P00 to P55 in six rows and six columns are arrayed in the sensor unit 10.

The circuit unit 20 includes a vertical selection circuit 21 that drives the unit pixel 11, and a signal processing circuit 22 that processes a signal output from the unit pixel 11. The circuit unit 20 further includes a horizontal selection circuit 23 for reading out a signal from the signal processing circuit 22, and a control circuit 24 that controls the operation of each circuit. FIG. 1 illustrates a signal line PVSEL for supplying a signal from the vertical selection circuit 21, an output signal line POUT for outputting a signal from each of the unit pixels 11, and a signal line PHSEL for supplying a signal from the horizontal selection circuit 23. Further, FIG. 1 illustrates a signal output line SOUT from the signal processing circuit 22.

The signal processing circuits 22 are provided in such a manner that each of the signal processing circuits 22 corresponds to a different one of columns formed of the plurality of unit pixels 11. The signal processing circuit 22 has a function of holding a signal output from the unit pixel 11. A plurality of output signal lines (an n-number of output signal lines in FIG. 1) is connected to the unit pixels 11 of one column. With such a configuration, each of the signal processing circuits 22 corresponding to a different one of columns can hold a plurality of signals output from one unit pixel.

(Configuration of Unit Pixel 11)

A specific configuration example of the unit pixel 11 will be described with reference to FIG. 2.

Figure 2:
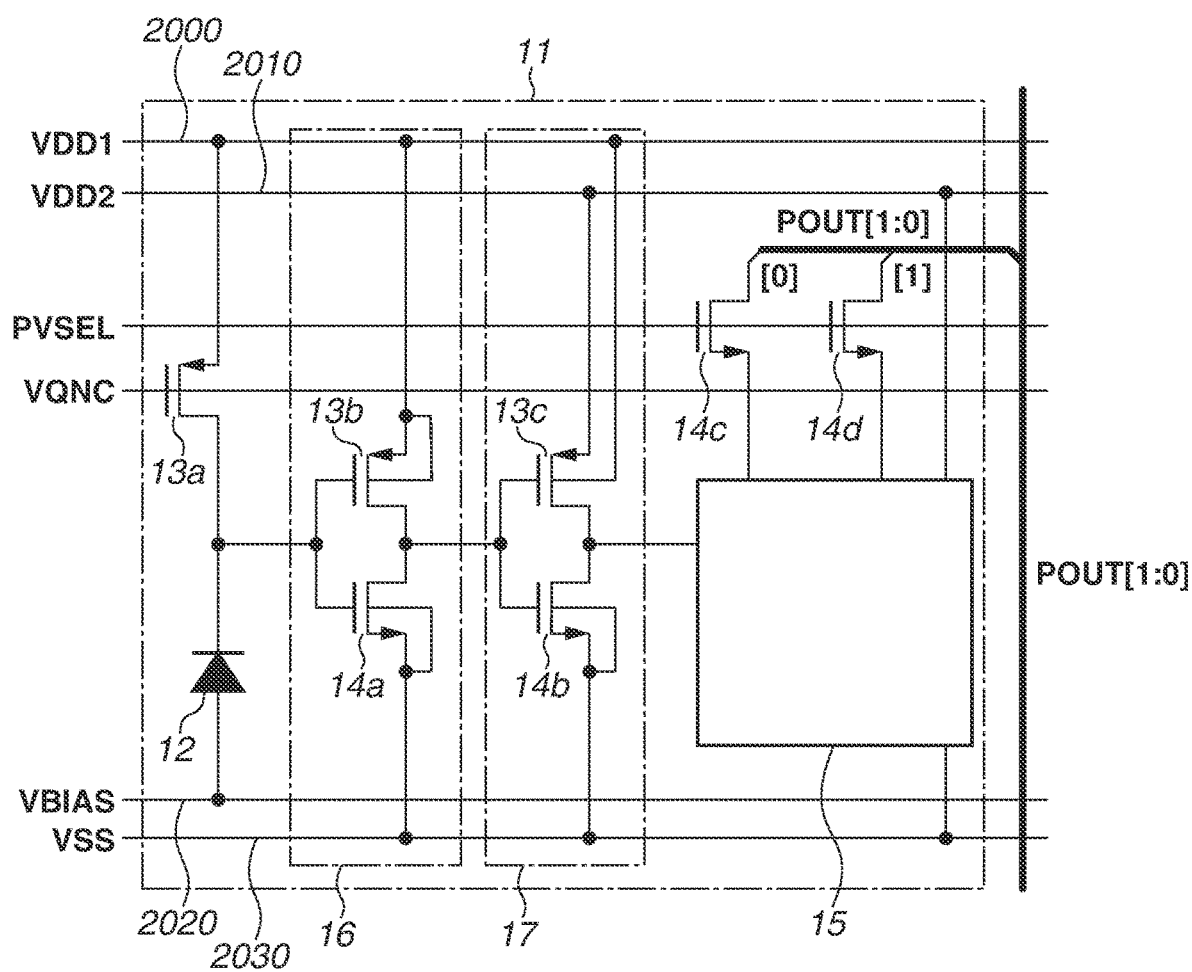
FIG. 2 is a diagram illustrating an equivalent circuit of the photoelectric conversion apparatus according to the first embodiment.

FIG. 2 is a diagram illustrating an equivalent circuit of a configuration example of the unit pixel 11. In FIG. 2, the unit pixel 11 includes a diode 12 of avalanche amplification type, P-channel metal oxide semiconductor (PMOS) transistors 13a to 13c, N-channel metal oxide semiconductor (NMOS) transistors 14a to 14d, and a counter circuit 15.

A reverse bias of a magnitude greater than or equal to a breakdown voltage is applied to the diode 12, and the diode 12 is set to operate in a Geiger mode. Specifically, a voltage VBIAS (a first power supply voltage) is applied from a power supply line 2020 to the anode side of the diode 12, and the voltage VDD1 (a second power supply voltage) is applied from a power supply line 2000 to the cathode side. The voltage difference between the voltage VBIAS and the voltage VDD1 is greater than or equal to the breakdown voltage. For example, the first power supply voltage is higher than the second power supply voltage, and the first power supply voltage is −20 V and the second power supply voltage is 3.3 V.

The PMOS transistor 13a is a quench element, and forms a predetermined quenching resistance based on a voltage VQNC. When a photon is incident on the diode 12, a plurality of electrons (and holes) is generated by an avalanche phenomenon. An electric current generated by the avalanche phenomenon flows through the quench element 13a, thereby causing a voltage drop. This causes the operational area of the diode 12 to fall outside the Geiger mode. The avalanche phenomenon of the diode 12 is thus stopped, and the voltage restores from the drop caused by the quench element 13a, so that the operational area of the diode 12 is restored to the Geiger mode.

The PMOS transistor 13b and the NMOS transistor 14a form an inverter circuit 16 to inversely amplify a change in the potential of the cathode of the diode 12. Because of the inverter circuit 16, the unit pixel 11 can shape a pulse signal indicating the presence or absence of photon incidence. Therefore, the inverter circuit may also be referred to as the "pulse shaping circuit".

The PMOS transistor 13c and the NMOS transistor 14b form an inverter circuit 17 to output an inversion signal (pulse signal) of an output of the inverter circuit 16 to the counter circuit 15.

The counter circuit 15 counts the number of pulses output from the inverter circuit 17 and outputs a cumulative counting result to the output signal line POUT via the switch of the NMOS transistors 14c and 14d.

The ON/OFF control in the NMOS transistors 14c and 14d is executed in the signal line PVSEL. FIG. 2 illustrates a case where a 2-bit counter is provided, as an example.

The source of the PMOS transistor 13a as well as the substrate and the source of the PMOS transistor 13b are connected to the power supply line 2000 so that the PMOS transistors 13a and 13b are supplied with the voltage VDD1. The counter circuit 15 is connected to a power supply line 2010 so that the counter circuit 15 is supplied with the voltage VDD2.

Here, from the viewpoint of the Geiger mode operation of the diode 12 described above, the voltage VDD1 (the second power supply voltage) to be applied to the quench element 13a needs a high voltage. For example, as described above, in a case where the voltage VBIAS (the first power supply voltage) to be supplied to the power supply line 2020 is −20 V, the voltage VDD1 (the second power supply voltage) needs to be 3.3 V. Further, the voltage to be supplied to the inverter circuit 16 also needs to coincide with the amplitude of an analog signal from the quench element 13a. The PMOS transistor 13a serving as the quench element is in the ON state based on the voltage VQNC. Therefore, in a case where there is no photon incidence, the potential of the cathode terminal of the diode 12 is VDD1. A large current flows through the PMOS transistor 13a, when the avalanche phenomenon of the diode 12 occurs due to the photon incidence. At such a moment, as for the potential of the cathode terminal of the diode 12, although a voltage drop occurs, the amplitude thereof also greatly varies depending on the characteristics of the diode 12 and the PMOS transistor 13a. Therefore, in order for the inverter circuit 16 to shape reliably the pulse signal into a signal indicating the presence or absence of the photon incidence, the voltage to be supplied to the inverter circuit 16 needs to be a high voltage. According to the present embodiment, the voltage to be supplied to the inverter circuit 16 is to be supplied from the power supply line 2000, so that the voltage VDD1 is applied to the inverter circuit 16. For example, the voltage VDD1 is 3.3 V and a voltage VSS of a power supply line 2030 is 0 V.

Meanwhile, considering the number of elements for configuring a circuit and its operating speed, a transistor more miniaturized than transistors for configuring the quench element 13a and the inverter circuit 16, i.e., a transistor to be driven by a low voltage, is used as a transistor for configuring the counter circuit 15. Specifically, the counter circuit 15 is supplied with the voltage VSS (a third power supply voltage) from the power supply line 2030, and supplied with the voltage VDD2 (a fourth power supply voltage) from the power supply line 2010. For this reason, the amplitude of the pulse signal in the counter circuit 15 is the difference between the third power supply voltage and the fourth power supply voltage. For example, in a case where the voltage VSS is 0 V and the voltage VDD2 is 1.8 V, the amplitude of the pulse signal is 1.8 V.

In this way, according to the present embodiment, the difference between the first power supply voltage and the second power supply voltage is greater than the difference between the third power supply voltage and the fourth power supply voltage. The fourth power supply voltage is lower than the second power supply voltage.

Meanwhile, the inverter circuit 16 is supplied with the voltage VSS (a fifth power supply voltage) from the power supply line 2030 and supplied with the voltage VDD1 (a sixth power supply voltage) from the power supply line 2000. For this reason, the amplitude of the pulse signal output from the inverter circuit 16 is the difference between the fifth power supply voltage and the sixth power supply voltage. For example, in a case where the voltage VSS is 0 V and the voltage VDD1 is 3.3 V, the amplitude of the pulse signal to be output from the inverter circuit 16 is 3.3 V.

The amplitude (e.g., 1.8 V) of the pulse signal in the counter circuit 15 and the amplitude (e.g., 3.3 V) of the pulse signal to be output from the inverter circuit 16 are different values from each other. In a case where a transistor that operates at a low voltage is used in a counter circuit to achieve a miniaturized structure and a higher speed, it is desirable that the amplitudes of the respective pulse signals be as close to each other as possible, from the viewpoint of withstand voltage and reliability. Thus, according to the present embodiment, a pulse signal having a first amplitude and output from the inverter circuit 16 is converted into a pulse signal having a second amplitude smaller than the first amplitude, by providing the inverter circuit 17. Because such a function is implemented, the inverter circuit 17 may also be referred to as the "pulse conversion circuit".

As an example, the voltage VSS (a seventh power supply voltage) of the power supply line 2030 supplied to the inverter circuit 17 is 0 V, and the voltage VDD2 (an eighth power supply voltage) of the power supply line 2010 is 1.8 V. In this case, before and after input of the inverter circuit 17, the amplitude of a pulse signal is converted from 3.3 V to 1.8 V. As described above, the amplitude of the pulse signal in the counter circuit 15 is, for example, 1.8 V, and therefore, an appropriate value is set for the amplitude of the pulse signal to be input to the counter circuit 15, by providing the inverter circuit 17.

(Modification of Pulse Shaping Circuit)

Figure 3:
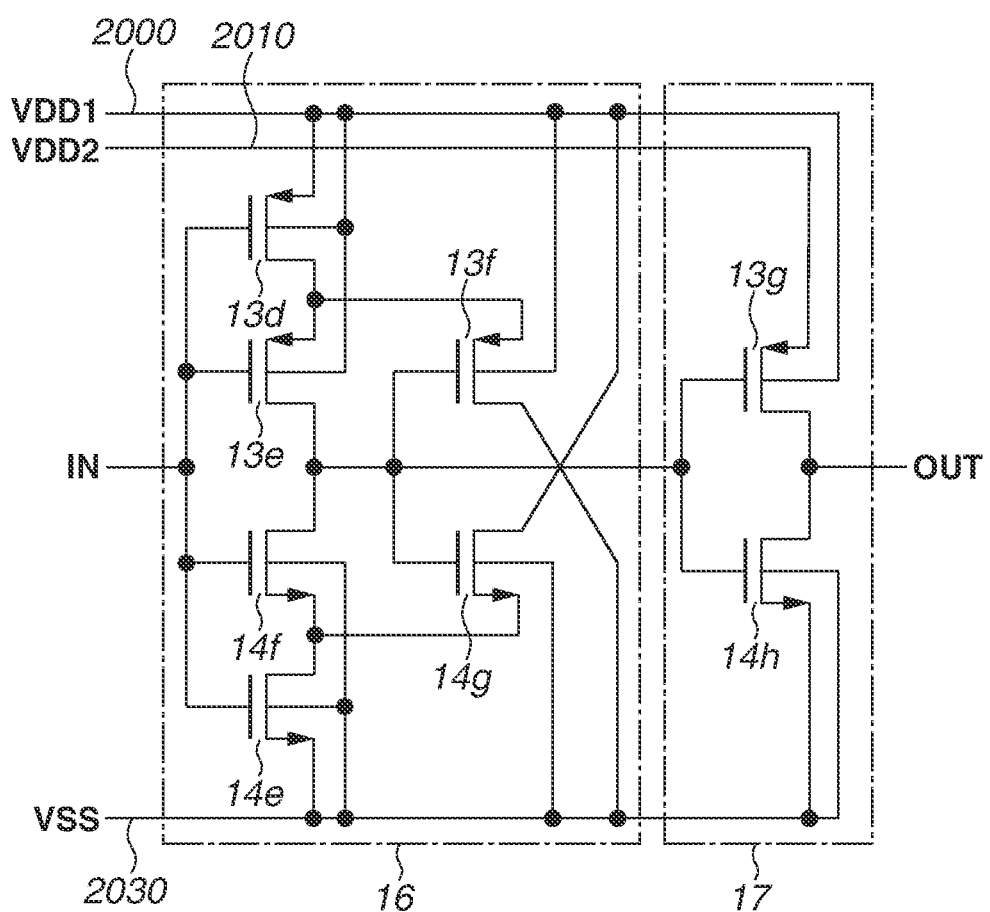
FIG. 3 is a diagram illustrating an equivalent circuit of the photoelectric conversion apparatus according to the first embodiment.

FIG. 3 illustrates another configuration example of the pulse shaping circuit (the inverter circuit 16) and the pulse conversion circuit (the inverter circuit 17) described above.

The pulse shaping circuit 16 illustrated in FIG. 3 includes PMOS transistors 13*d* to 13*f*, and NMOS transistors 14*f* and 14*g*. The PMOS transistor 13*e* and the NMOS transistor 14*f* are provided to form an inverter. The drain of the PMOS transistor 13*d* and the source of the PMOS transistor 13*f* are connected to the source of the PMOS transistor 13*e*. Further, the source of the PMOS transistor 13*d* is connected to the power supply line 2000, and the drain of the PMOS transistor 13*f* is connected to the power supply line 2030. The PMOS transistors 13*d* and 13*f* control the source potential of the PMOS transistor 13*e* via the respective drains based on the respective gate potentials. Similarly, the drain of the NMOS transistor 14*e* and the source of the NMOS transistor 14*g* are connected to the source of the NMOS transistor 14*f*.

Further, the source of the NMOS transistor 14*e* is connected to the power supply line 2030, and the drain of the NMOS transistor 14*g* is connected to the power supply line 2000. The NMOS transistors 14*e* and 14*g* control the source potential of the NMOS transistor 14*f* via the respective drains based on the respective gate potentials. Therefore, the pulse shaping circuit 16 forms a Schmitt trigger circuit in which an output state changes while having hysteresis, in response to a change in input potential.

The pulse conversion circuit 17 is an inverter circuit including the PMOS transistor 13*g* and the NMOS transistor 14*h*, and converts a high level of an output pulse from the voltage VDD1 to the voltage VDD2.

As illustrated in FIG. 3, providing the pulse shaping circuit 16 as the Schmitt trigger circuit produces such an advantage that it is easy to adjust a threshold in converting the output signal of the diode 12 into a pulse.

(Cross-Sectional Diagram)

Figure 4:
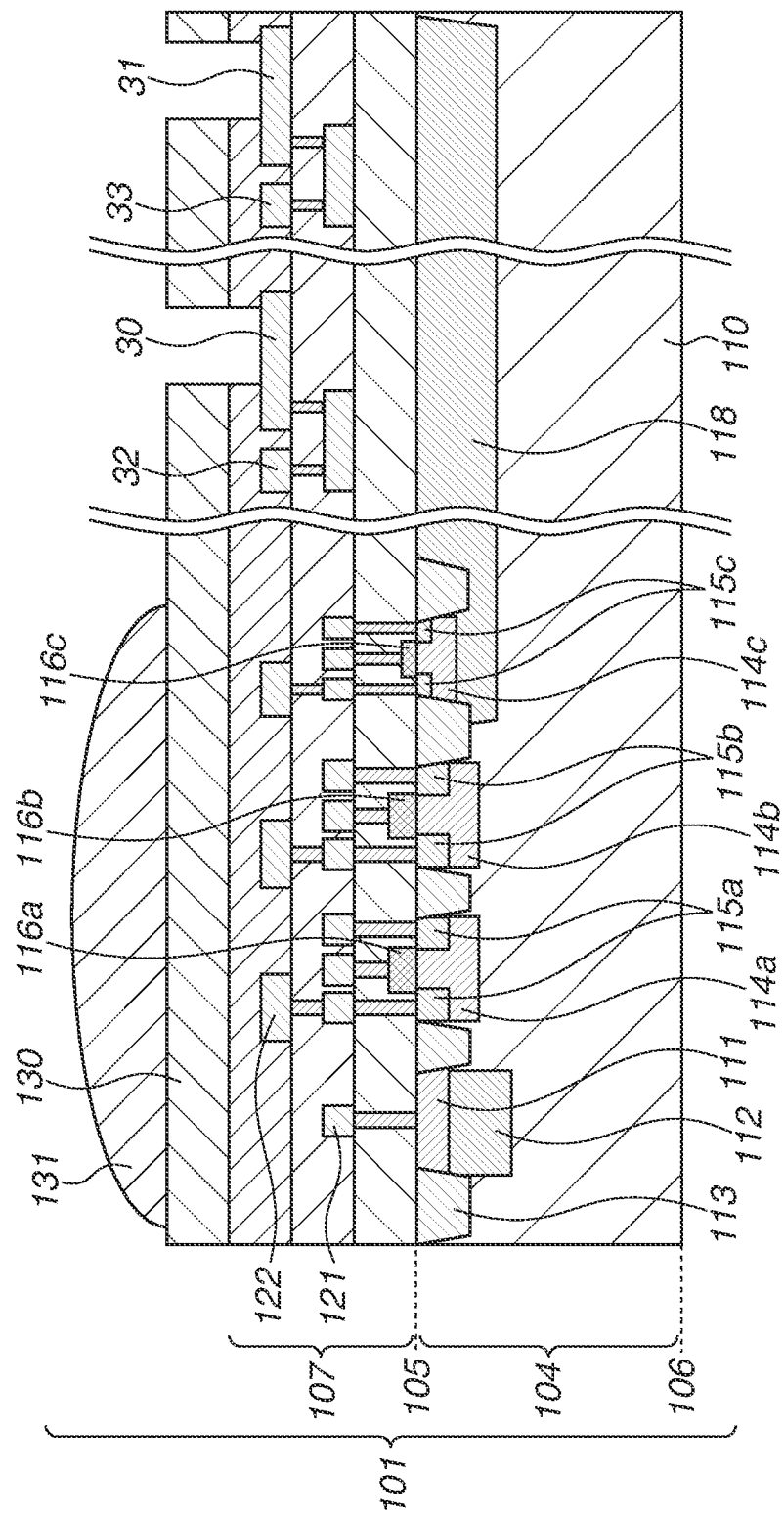
FIG. 4 is a cross-sectional diagram illustrating the photoelectric conversion apparatus according to the first embodiment.

FIG. 4 is a cross-sectional diagram of the photoelectric conversion apparatus according to the present embodiment.

A first chip 101 has a first substrate 104. The first substrate 104 is, for example, a silicon substrate. In the first substrate 104, a surface where a wiring layer is formed is a main surface 105 and another surface of the first substrate 104 opposite to the main surface 105 is a back surface 106. A multilayer wiring structure 107 that includes a first wiring layer 121 and a second wiring layer 122 is provided on the main surface 105 of the first substrate 104 in the first chip 101. Here, for example, a plug made of tungsten establishes connection, such as connection between the wiring of the first wiring layer 121 and the wiring of the second wiring layer 122, and connection between a gate electrode and the wiring of the first wiring layer.

The first substrate 104 is provided with, for example, a well 110 of P-type, and an active region and a non-active region (a field region) are isolated from each other by an element isolation region 113.

An N-type region 111 and a P-type region 112 included in the diode 12 are provided in the well 110. When light is incident on the diode 12, a plurality of electrons is generated by the avalanche phenomenon and then read out via the N-type region 111.

A PMOS transistor (a first PMOS transistor) is provided in the well 110. This PMOS transistor has a gate 116*a*, a source-drain region 115*a*, and an N-type well region 114*a*. The first PMOS transistor is a transistor that uses the voltage VDD1. For example, the first PMOS transistor is each of the PMOS transistors 13*a* and 13*b*.

Further, a PMOS transistor (a second PMOS transistor) is provided in the well 110. This PMOS transistor has a gate 116*b*, a source-drain region 115*b*, and an N-type well region 114*b*. The second PMOS transistor uses the voltage VDD2. For example, the second PMOS transistor is the PMOS transistor 13*c*.

In the first substrate 104, a well region 118 of P-type is provided in the well 110. A PMOS transistor (a third PMOS transistor) is provided in the well region 118. This PMOS transistor has a gate 116*c*, a source-drain region 115*c*, and an N-type well region 114*c*. In other words, the third PMOS transistor is a transistor formed in a well different from those of the first and second PMOS transistors. The third PMOS transistor uses the voltage VDD2. For example, the third PMOS transistor is a PMOS transistor included in the counter circuit 15.

The line 32 which is a first line for supplying the voltage VDD1 is electrically connected to the source-drain region 115*a* of the first PMOS transistor, via the wiring of each wiring layer. Further, a first terminal (a first PAD) 30 is electrically connected to the first line 32, and the first line 32 is supplied with the voltage VDD1 from the outside of the chip, via the first terminal 30.

The line 33 which is a second line for supplying the voltage VDD2 is electrically connected to the source-drain region 115b of the second PMOS transistor and the source-drain region 115c of the third PMOS transistor, via the wiring of each wiring layer. A second terminal (a second PAD) 31 is electrically connected to the second line 33, and the second line 33 is supplied with the voltage VDD2 from the outside of the chip, via the second terminal 31.

A color filter layer 130 is provided on the multilayer wiring structure 107, and a microlens 131 is provided on the color filter layer 130.

Each member illustrated in FIG. 4 is a schematic representation, and the N-type region 111 and the P-type region 112 included in the diode 12 may be configured to have a wider area. Further, according to the present embodiment, the inverter circuits 16 and 17 are provided to each diode. For this reason, as illustrated in FIG. 4, the microlens 131 is provided to correspond to the diode 12, and the microlens 131 is provided to correspond also to the transistors forming the inverter circuits 16 and 17. In this case, the microlens 131 is provided to overlap the transistors forming the inverter circuits 16 and 17.

Modification

In the above-described example, the value of the difference between the third power supply voltage and the fourth power supply voltage is equalized to the value of the difference between the seventh power supply voltage and the eighth power supply voltage. In other words, the amplitude of the pulse signal of the counter circuit 15 and the amplitude of the pulse signal of the output from the inverter circuit 17 are equalized. However, this is not an essential requirement, because an issue that is to be solved is a difference between the amplitude of the pulse signal output from the inverter circuit 16 and the amplitude of the pulse signal of the counter circuit 15, and the present embodiment is to reduce the difference. In other words, the value of each power supply voltage can be appropriately set, as long as the value satisfies a condition that is (the difference between the fifth power supply voltage and the sixth power supply voltage)>(the difference between the seventh power supply voltage and the eighth power supply voltage)≥(the difference between the third power supply voltage and the fourth power supply voltage). This can also be considered as (the difference between the power supply voltages supplied to the pulse shaping circuit)>(the difference between the power supply voltages supplied to the pulse conversion circuit)≥ (the difference between the power supply voltages supplied to the signal processing circuit). In other words, as for the fifth to eighth power supply voltages, the difference between the seventh power supply voltage and the eighth power supply voltage may be greater than or equal to the difference between the third power supply voltage and the fourth power supply voltage.

From a different viewpoint, it may be said that the issue that is addressed by the present embodiment can be also solved if the value of the amplitude of the pulse signal output from the inverter circuit 16 is reduced by the inverter circuit 17. In this case, the value of each power supply voltage can be appropriately set, as long as the value satisfies a condition that is (the difference between the fifth power supply voltage and the sixth power supply voltage)>(the difference between the seventh power supply voltage and the eighth power supply voltage).

Further, each of the first power supply voltage to the eighth power supply voltage may have a different value. However, if the second power supply voltage and the sixth power supply voltage have the same value as in the configuration according to the present embodiment, a power supply line can be shared, and therefore, a device structure can be simplified. Similarly, a power supply line can be shared in such a manner that the third power supply voltage, the fifth power supply voltage, and the seventh power supply voltage are set to the same value. Similarly, a power supply line can be shared in such a manner that the fourth power supply voltage and the eighth power supply voltage are set to the same value.

A second embodiment is different from the first embodiment in that a first chip and a second chip are layered.

Figure 5:
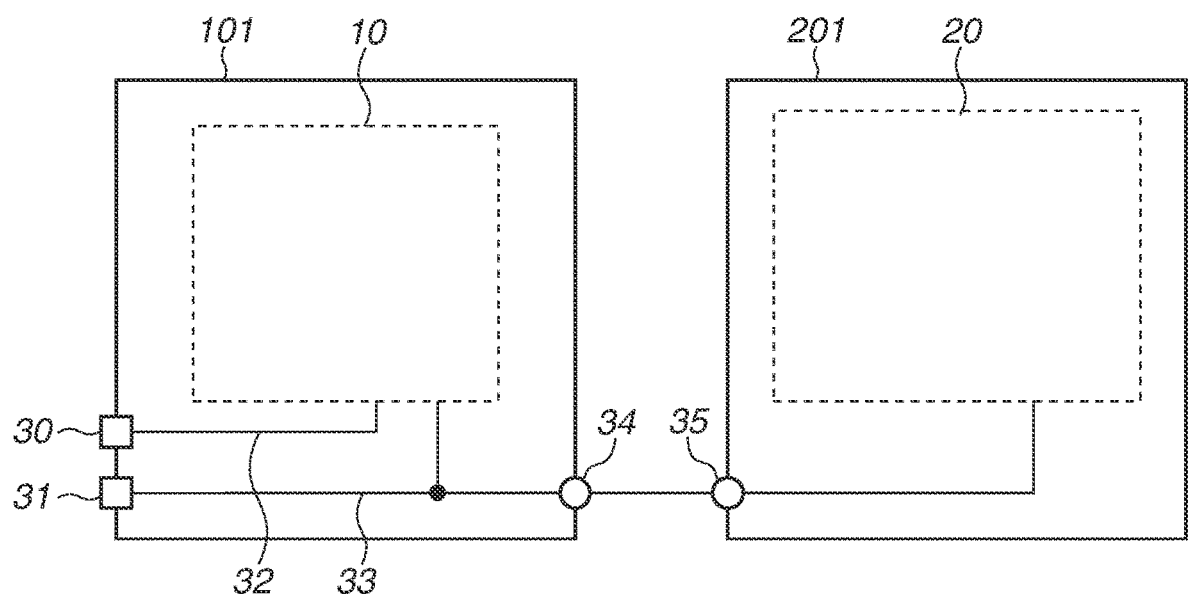
FIG. 5 is a diagram illustrating a configuration of a photoelectric conversion apparatus according to a second embodiment.

FIG. 5 is a schematic structural diagram of a photoelectric conversion apparatus according to the present embodiment. A first chip 101 is provided with a sensor unit 10, and a second chip 201 is provided with a circuit unit 20. The first chip 101 and the second chip 201 are layered. From a first terminal 30, a voltage VDD1 is supplied to the sensor unit 10 via a first line 32. From a second terminal 31, a voltage VDD2 is supplied to the sensor unit 10 via a second line 33. A first connecting portion 34 of the first chip 101 and a second connecting portion 35 of the second chip 201 are electrically connected in such a that the voltage VDD2 is to be supplied also to the circuit unit 20, via the second line 33, the first connecting portion 34, and the second connecting portion 35.

Figure 6:
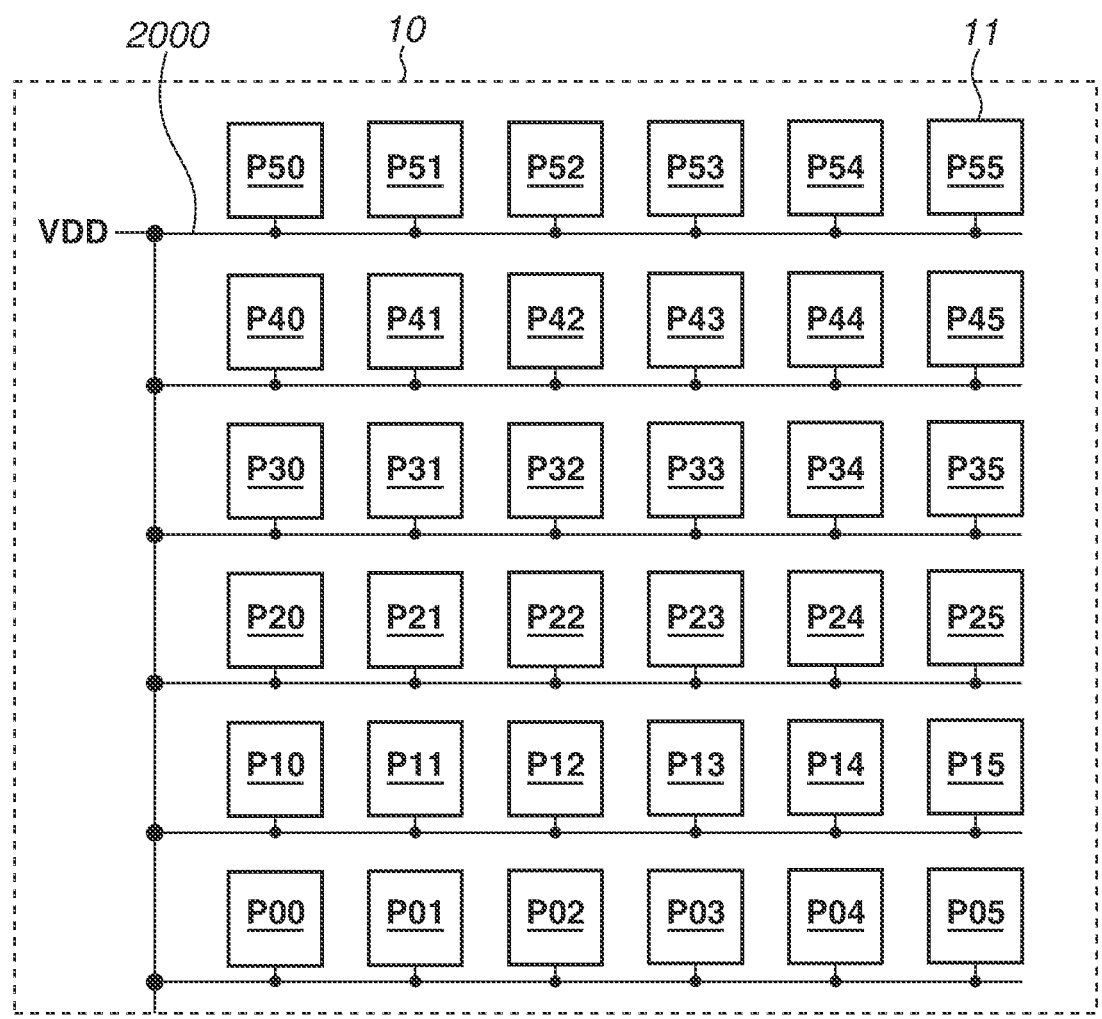
FIG. 6 is a diagram illustrating a configuration of the photoelectric conversion apparatus according to the second embodiment.

FIG. 6 is a schematic structural diagram of the sensor unit 10 provided in the first chip 101. A plurality of unit pixels 11 is arranged in a matrix, and the voltage VDD1 is supplied to each of the unit pixels 11. FIG. 6 illustrates a case where the unit pixels 11 indicated by P00 to P55 in six rows and six columns are arrayed in the sensor unit 10, and the pixels P00 to P55 each have at least a diode 12.

Figure 7:
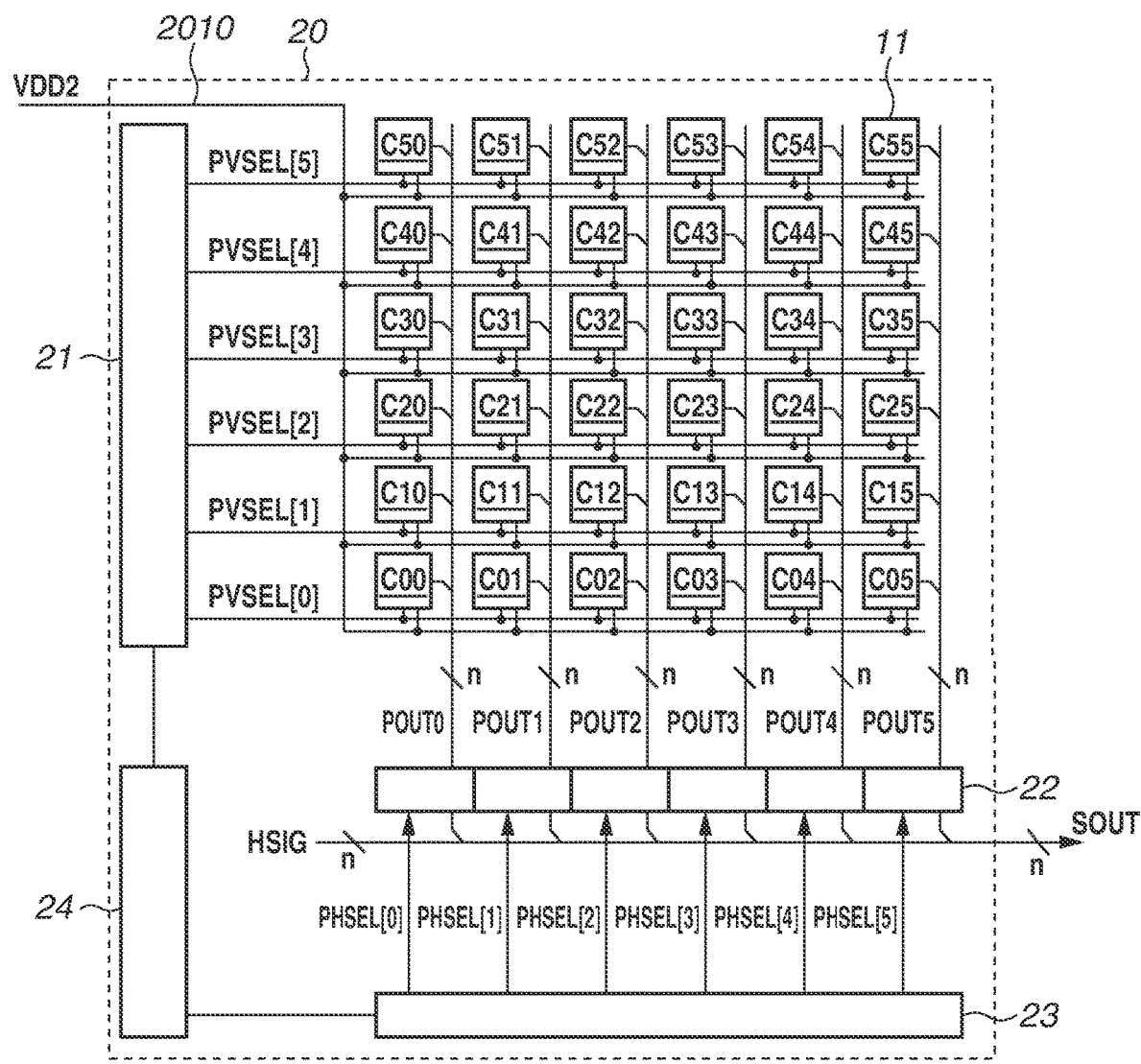
FIG. 7 is a diagram illustrating a configuration of the photoelectric conversion apparatus according to the second embodiment.

FIG. 7 is a schematic structural diagram of the circuit unit 20 provided in the second chip 201. The plurality of unit pixels 11 is arranged in a matrix, and the voltage VDD2 is supplied to each of the unit pixels 11. FIG. 7 illustrates a case where the unit pixels 11 indicated by C00 to C55 in six rows and six columns are arrayed in the circuit unit 20, and the pixels C00 to C55 each have at least a circuit that processes a signal output from the diode 12.

Figure 8:
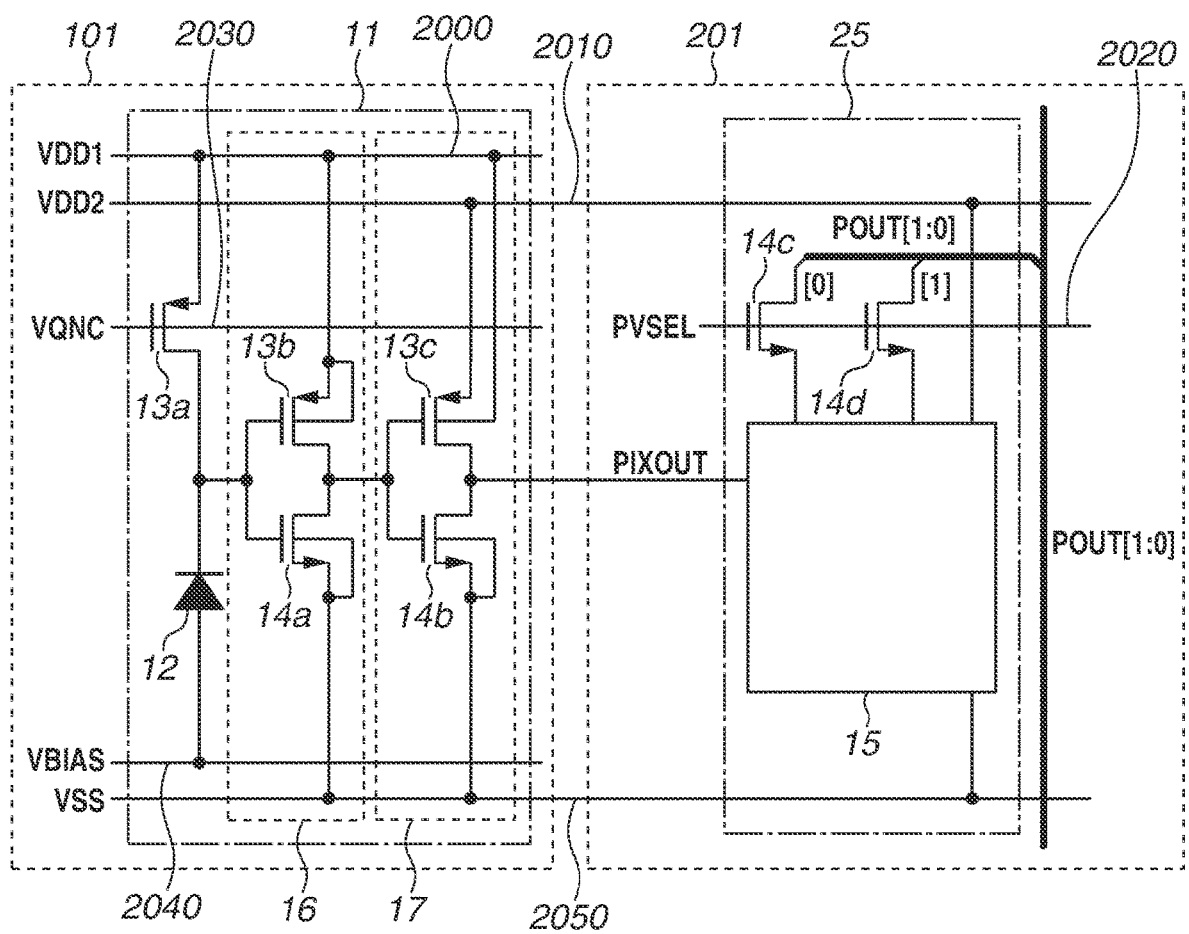
FIG. 8 is a diagram illustrating an equivalent circuit of the photoelectric conversion apparatus according to the second embodiment.

FIG. 8 is an equivalent circuit diagram illustrating a configuration example of the unit pixel 11. FIG. 8 is different from FIG. 2 described in the first embodiment, in that inverter circuits 16 and 17 are provided in the first chip 101, and a counter circuit 15 is provided in the second chip 201. According to the present embodiment, for the purpose of achieving a miniaturized structure, a plurality of transistors included in the counter circuit 15 has a gate oxide film reduced in thickness. Meanwhile, the inverter circuit 17 is supplied with the voltage VDD1 and the voltage VDD2, to function as a pulse conversion unit. Considering that a high level of a pulse to be input to the inverter circuit 17 is the voltage VDD1, a transistor included in the inverter circuit 17 has a gate oxide film that is thick to some extent to secure a withstand voltage. For this reason, if the inverter circuit 17 is provided in the second chip 201, transistors that have the gate oxide films of different thicknesses are mixed in the second chip 201. This complicates a process in manufacturing the second chip 201. Therefore, according to the present embodiment, the inverter circuit 17 to be the pulse conversion unit is provided in the first chip 101, not in the second chip 201.

Figure 9:
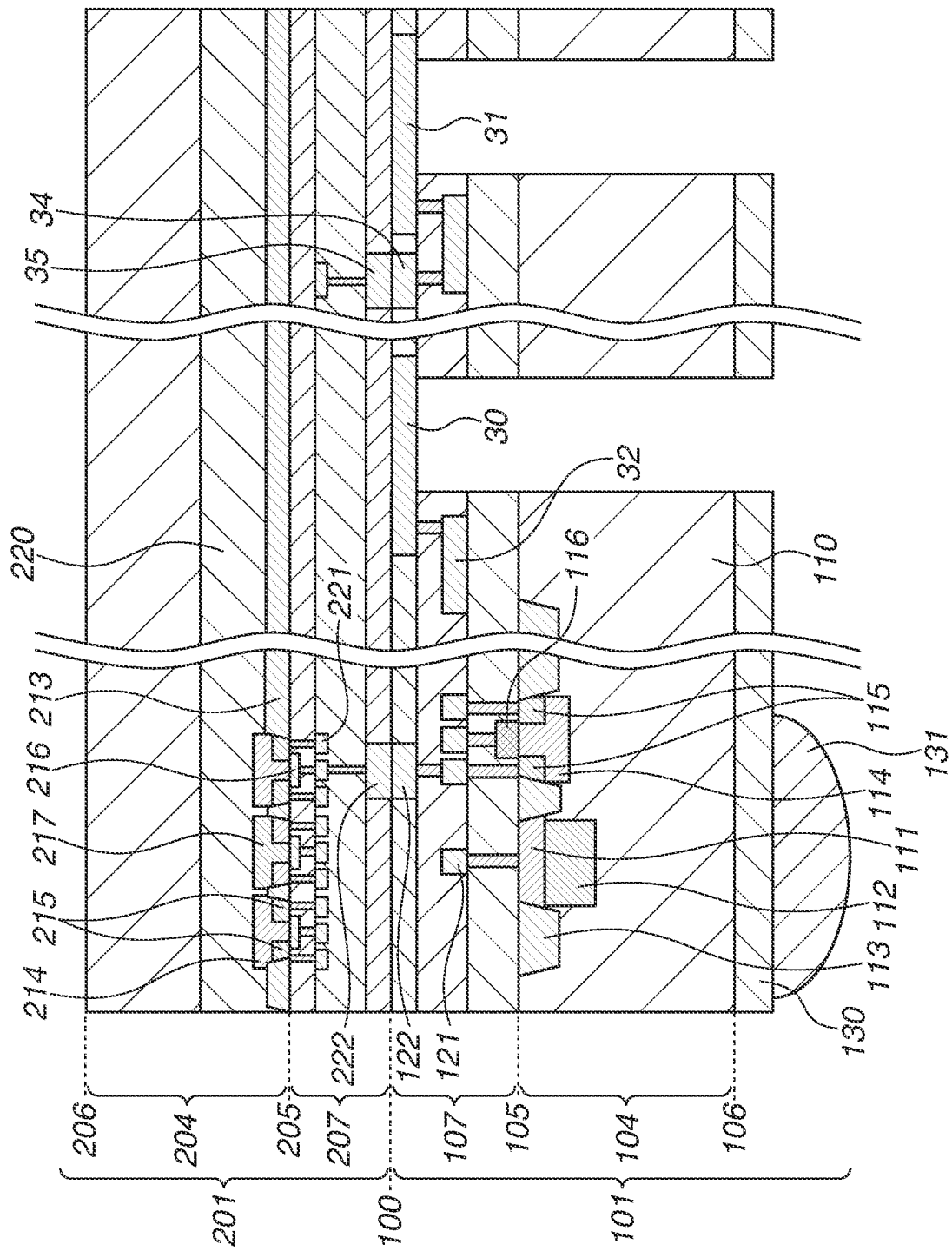
FIG. 9 is a cross-sectional diagram illustrating the photoelectric conversion apparatus according to the second embodiment.

FIG. 9 is a cross-sectional diagram of the photoelectric conversion apparatus according to the present embodiment. The present embodiment is different from the first embodiment illustrated in FIG. 4, in that a microlens 131 is provided on a back surface 106 of a first substrate 104, instead of being provided on a main surface 105 of the first substrate 104. Further, the first chip 101 and the second chip 201 are joined via a joint plane 100.

The second chip 201 has a second substrate 204. The second substrate 204 has a main surface 205 and a back surface 206. An active region and a non-active region are isolated from each other by an element isolation region 213. A well 220 is formed in the second substrate 204, and a plurality of transistors each having a gate 216, a source-drain region 215, and a well region 214 (217) is formed. In FIG. 9, for example, a transistor having the well region 214 of N type is a PMOS transistor, and a transistor having the well region 217 of P type is an NMOS transistor. In this way, the plurality of transistors including the NMOS transistor and the PMOS transistor is appropriately disposed in the second substrate 204.

The wiring of a second wiring layer 122 that is the uppermost layer of a multilayer wiring structure 107 and the wiring of a second wiring layer 222 that is the uppermost layer of a multilayer wiring structure 207 are in contact with each other at the joint plane 100, whereby electric connection is secured.

The first terminal 30 is for supplying the voltage VDD1 to be supplied to a photodiode disposed in the sensor unit 10 of the first chip. The first terminal 30 is connected to the sensor unit 10 via the line 32. Further, the second terminal 31 is a terminal for supplying the voltage VDD2 to be supplied to both of the sensor unit 10 of the first chip and the circuit unit 20 of the second chip.

According to the present embodiment, the line 33 passes through the joint plane 100 between the first chip and the second chip to supply the voltage VDD2 to both of the chips. Further, the line 33 has the first connecting portion 34 and the second connecting portion 35, and the first connecting portion 34 and the second connecting portion 35 are in contact with each other at the joint plane 100. The number of processes for forming an opening (a pad opening) for terminal can be reduced by providing the first terminal 30 and the second terminal 31 only in the first chip 101 that is one of the chips. In addition, the process for forming the opening for terminal can be simplified by providing the first terminal 30 and the second terminal 31 in the same wiring layer.

A third embodiment is similar to the second embodiment in that a first chip and a second chip are layered. However, the third embodiment is different from the second embodiment in that a power supply circuit unit is provided, and a single terminal is provided for connection to outside.

Figure 10:
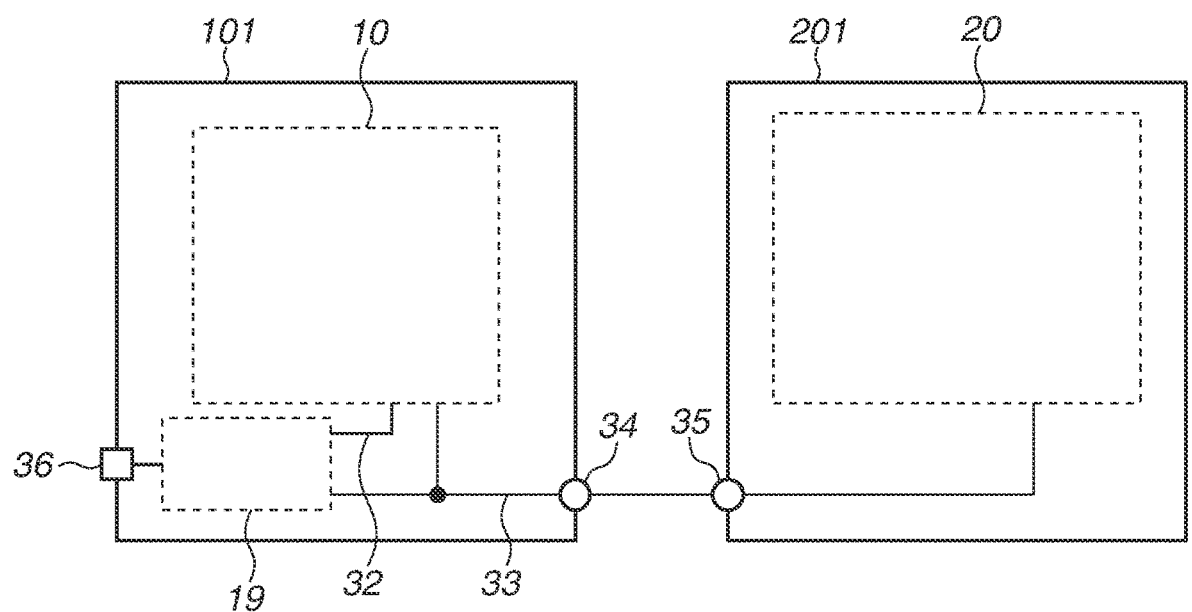
FIG. 10 is a diagram illustrating a configuration of a photoelectric conversion apparatus according to a third embodiment.

FIG. 10 is a schematic structural diagram of a photoelectric conversion apparatus according to the present embodiment. A first chip 101 is provided with a sensor unit 10, and a second chip 201 is provided with a circuit unit 20. The first chip 101 is further provided with a power supply circuit unit 19. The power supply circuit unit 19 generates a voltage VDD1 and a voltage VDD2, from a voltage supplied from outside via a third terminal (a third PAD) 36. The voltage VDD1 generated by the power supply circuit unit 19 is supplied to the sensor unit 10 via a first line 32. The voltage VDD2 generated by the power supply circuit unit 19 is supplied to the sensor unit 10 via a second line 33. A first connecting portion 34 of the first chip 101 and a second connecting portion 35 of the second chip 201 are electrically connected so that the voltage VDD2 is supplied also to the circuit unit 20 via the first connecting portion 34 and the second connecting portion 35.

Figure 11:
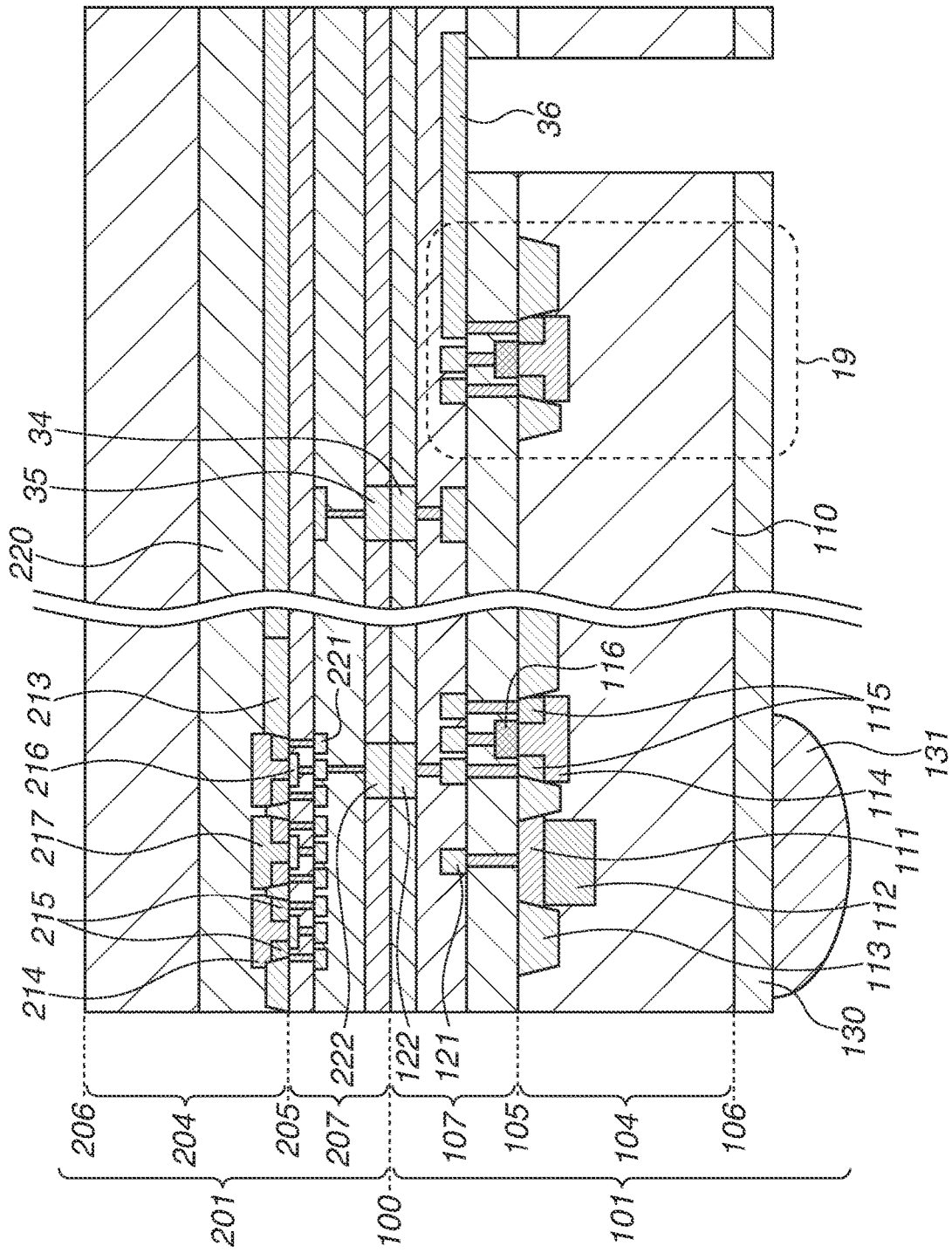
FIG. 11 is a cross-sectional diagram illustrating the photoelectric conversion apparatus according to the third embodiment.

FIG. 11 is a cross-sectional diagram of the photoelectric conversion apparatus according to the present embodiment. As for the voltage VDD2 to be generated by the power supply circuit unit 19, the line 33 is provided to pass through a joint plane 100 between the first chip and the second chip to supply the voltage VDD2 to both of the chips. The line 33 has the first connecting portion 34 and the second connecting portion 35. The first connecting portion 34 and the second connecting portion 35 are in contact with each other at the joint plane 100. Providing the power supply circuit unit 19 can reduce terminals, and therefore can reduce the number of processes for forming an opening (a pad opening) for a terminal.

A fourth embodiment is similar to the second and third embodiments in that a first chip and a second chip are layered. However, two terminals are provided unlike the third embodiment, and the two terminals are provided in the second chip instead of being provided in the first chip, unlike the second embodiment.

Figure 12:
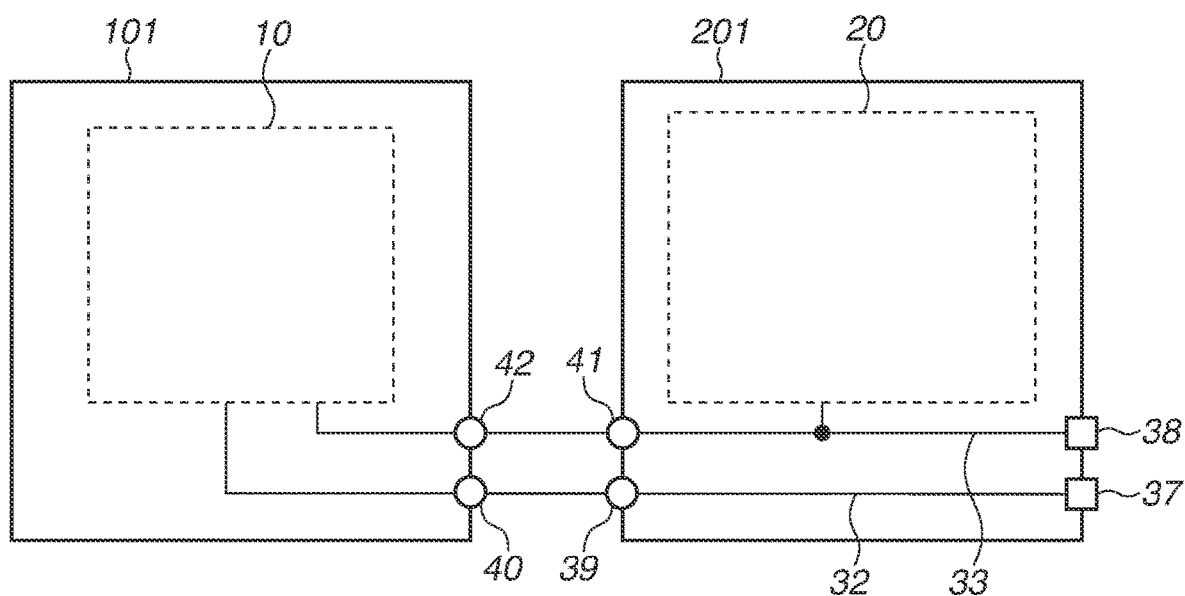
FIG. 12 is a diagram illustrating a configuration of a photoelectric conversion apparatus according to a fourth embodiment.

FIG. 12 is a schematic structural diagram of a photoelectric conversion apparatus according to the present embodiment. A first chip 101 is provided with a sensor unit 10, and a second chip 201 is provided with a circuit unit 20. A fourth terminal (a fourth PAD) 37 is a terminal for a voltage VDD1, and connected to the sensor unit 10 via a line 32, a third connecting portion 39, and a fourth connecting portion 40. A fifth terminal (a fifth PAD) 38 is a terminal for a voltage VDD2, and supplies the voltage VDD2 to the circuit unit 20 via a line 33. The fifth terminal 38 supplies the voltage VDD2 also to the sensor unit 10, via the line 33, a fifth connecting portion 41, and a sixth connecting portion 42.

Figure 13:
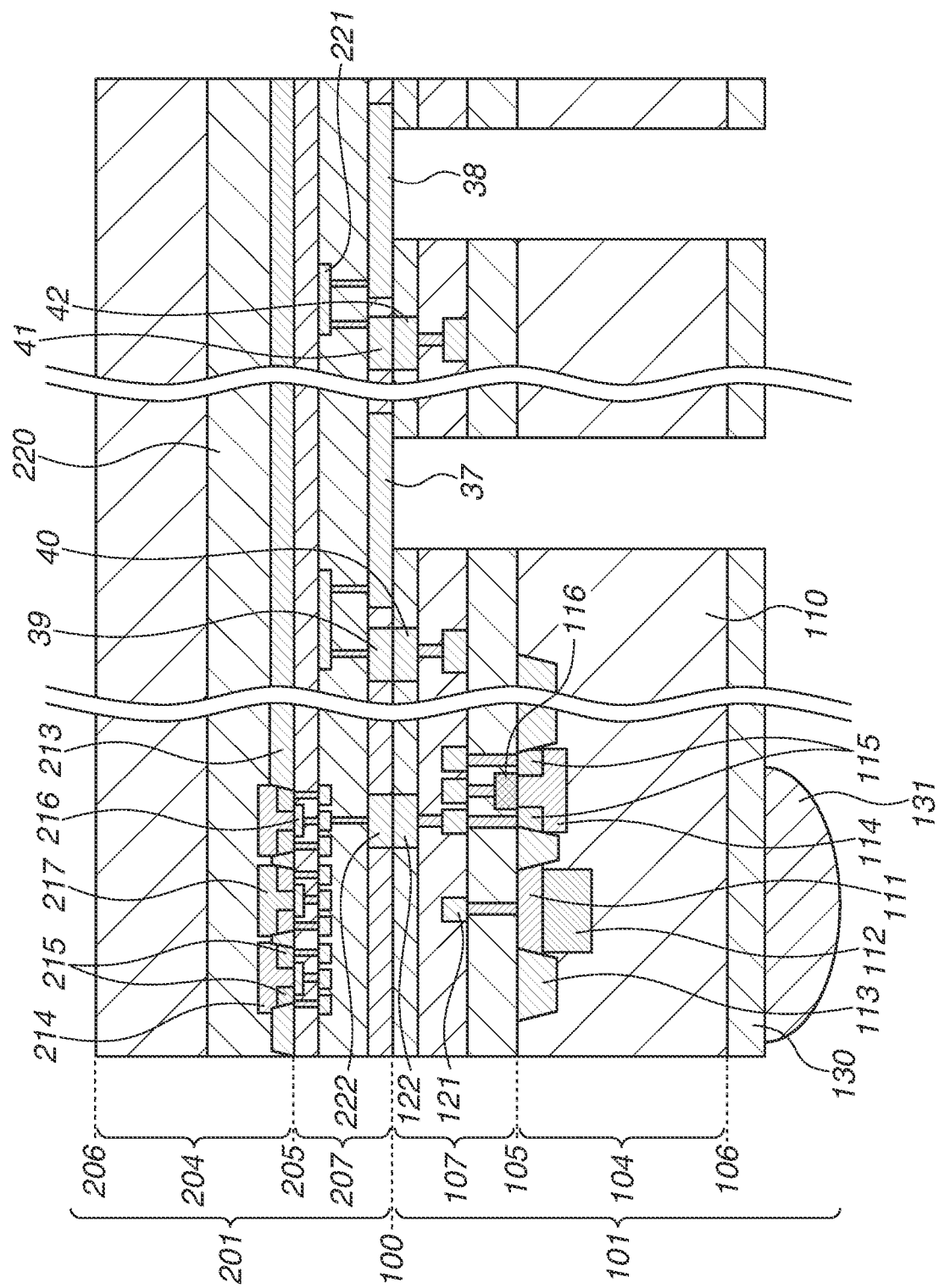
FIG. 13 is a cross-sectional diagram illustrating the photoelectric conversion apparatus according to the fourth embodiment.

FIG. 13 is a cross-sectional diagram of the photoelectric conversion apparatus according to the present embodiment. The fourth terminal 37 and the fifth terminal 38 are both provided in the second chip 201, and provided in the same wiring layer. According to the present embodiment, the line 33 for supplying the voltage VDD2 is provided in the first chip and the second chip, and passes through a joint plane 100 between the first chip and the second chip to supply the voltage VDD2 to both of the chips. The line 33 has the fifth connecting portion 41 and the sixth connecting portion 42, and the fifth connecting portion 41 and the sixth connecting portion 42 are in contact with each other at the joint plane 100. Further, according to the present embodiment, the line 32 for supplying the voltage VDD1 is provided in both of the chips, and the line 32 thus passes through the joint plane 100. The line 32 has the third connecting portion 39 and the fourth connecting portion 40, and the third connecting portion 39 and the fourth connecting portion 40 are in contact with each other at the joint plane 100.

The number of processes for forming an opening (a pad opening) for a terminal can be reduced by providing both of the fourth terminal 37 and the fifth terminal 38 in the second chip that is one of the chips. In addition, the process for forming the opening for a terminal can be simplified by providing the fourth terminal 37 and the fifth terminal 38 in the same wiring layer.

According to the present embodiment, the line for supplying the voltage VDD1 (the second power supply voltage) and the line for supplying the voltage VDD2 (the fourth power supply voltage) are both disposed to pass through the joint plane between the first chip and the second above chip. However, according to an embodiment of the present invention, as exemplified by the second and third embodiments, at least one of the line for supplying the second power supply voltage and the line for supplying the fourth power supply voltage may be disposed to pass through the joint plane.

Figure 14:
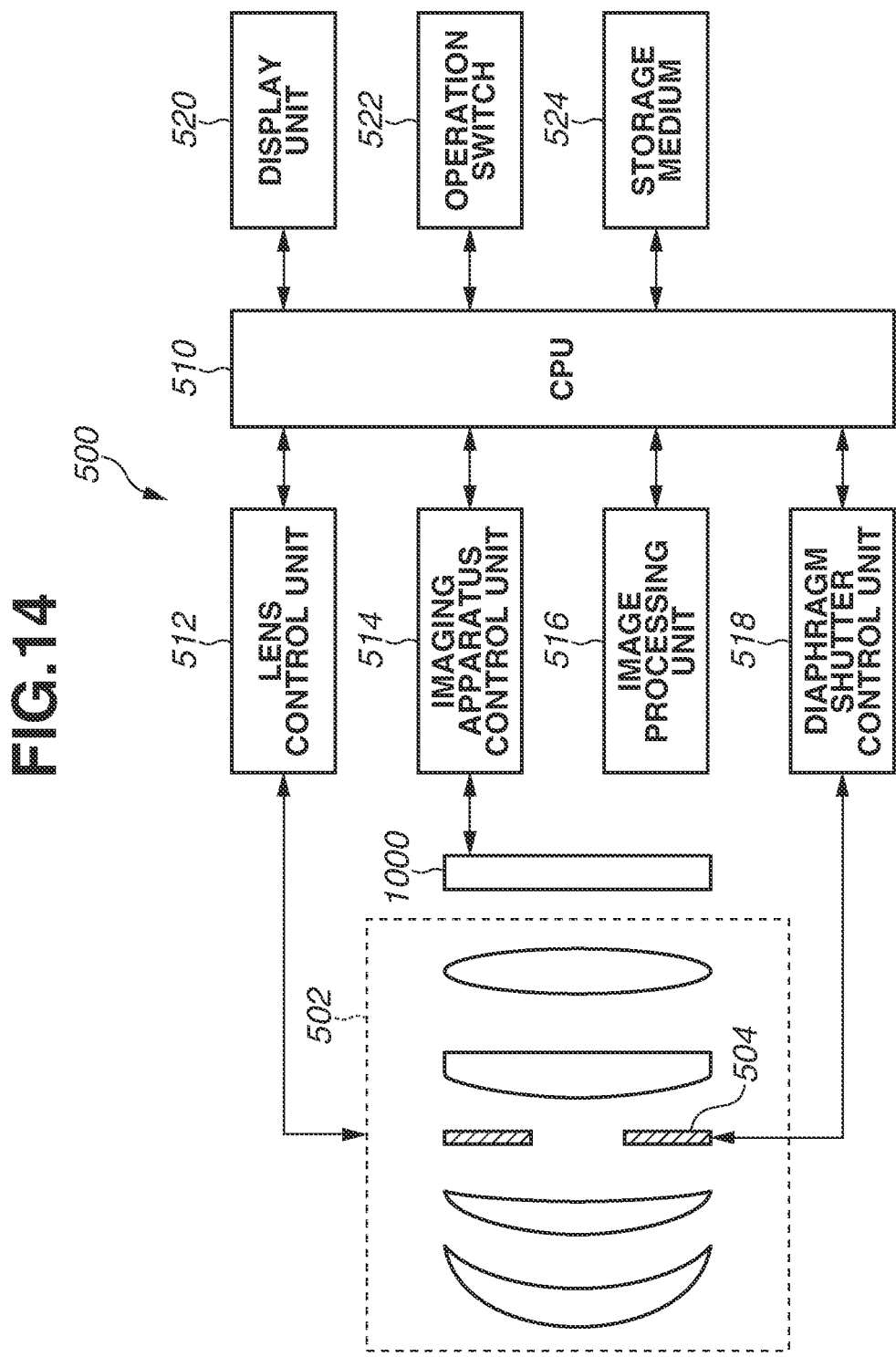
FIG. 14 is a diagram illustrating a configuration of an imaging system according to a fifth embodiment.

An imaging system according to a fifth embodiment of the present invention will be described with reference to FIG. 14. FIG. 14 is a block diagram illustrating a schematic configuration of the imaging system according to the present embodiment.

The photoelectric conversion apparatus described above in each of the first to fourth embodiments is applicable to various imaging systems. The imaging system to which the photoelectric conversion apparatus is applicable is not limited in particular. Examples of such an imaging system include various apparatuses, such as a digital still camera, a digital camcorder, a surveillance camera, a copier, a facsimile, a mobile phone, an on-vehicle camera, an observation satellite, and a medical camera. A camera module including an optical system, such as a lens, and a photoelectric conversion apparatus is also included in the examples of the imaging system. FIG. 14 illustrates a block diagram of a digital still camera provided as an example of these apparatuses.

An imaging system 500 includes a photoelectric conversion apparatus 1000, an imaging optical system 502, a central processing unit (CPU) 510, a lens control unit 512, an imaging apparatus control unit 514, an image processing unit 516, a diaphragm shutter control unit 518, a display unit 520, an operation switch 522, and a storage medium 524.

The imaging optical system 502 is an optical system for forming an optical image of an object, and includes a lens group and a diaphragm 504. The diaphragm 504 has a function of adjusting a light amount in image capturing by adjusting the aperture diameter thereof. The diaphragm 504 also has a function of serving as an exposure-time adjustment shutter in still-image capturing. The lens group and the diaphragm 504 are held to be capable of proceeding and retreating along an optical axis direction. Interlocking operation of these components implements a magnification varying function (a zoom function) and a focal-point adjustment function. The imaging optical system 502 may be integrated with the imaging system, or may be an imaging lens that can be attached to the imaging system.

The photoelectric conversion apparatus 1000 is disposed in such a manner that the imaging plane of the photoelectric conversion apparatus 1000 is positioned in an image space of the imaging optical system 502. The photoelectric conversion apparatus 1000 is the photoelectric conversion apparatus described in each of the first to fourth embodiments. The photoelectric conversion apparatus 1000 photoelectrically converts an object image formed by the imaging optical system 502, and outputs the result as an image signal or a focus detection signal.

The lens control unit 512 controls driving in proceeding and retraction of the lens group of the imaging optical system 502 to perform a variable power operation and a focal point adjustment. The lens control unit 512 includes a circuit or processor configured to implement such a function. The diaphragm shutter control unit 518 changes the aperture diameter of the diaphragm 504 (an aperture value is variable) to adjust an image-capturing light amount. The diaphragm shutter control unit 518 includes a circuit or processor configured to implement such a function.

The CPU 510 is a controller provided inside a camera and performing various kinds of control of a camera body. The CPU 510 includes an arithmetic unit, a read only memory (ROM), a random access memory (RAM), an analog-to-digital (A/D) converter, a digital-to-analog (D/A) converter, and a communication interface circuit. The CPU 510 controls the operation of each unit inside the camera based on a computer program stored in a memory, such as the ROM, to execute a series of image-capturing operation processes, including autofocus (AF), imaging, image processing, and recording. The CPU 510 also serves as a signal processing unit.

The imaging apparatus control unit 514 controls the operation of the photoelectric conversion apparatus 1000. The imaging apparatus control unit 514 also performs A/D conversion of a signal output from the photoelectric conversion apparatus 1000 and transmits a resultant signal to the CPU 510. The imaging apparatus control unit 514 includes a circuit or processor configured to implement those functions. The A/D conversion function may be included in the photoelectric conversion apparatus 1000. The image processing unit 516 generates an image signal by performing image processing, such as γ-conversion and color interpolation, on the signal subjected to the A/D conversion. The image processing unit 516 includes a circuit or controller configured to implement such a function. The display unit 520 displays information about an image-capturing mode of the camera, a preview image before image capturing, an image for checking after image capturing, and a focusing state in focus detection. The operation switch 522 includes switches, such as a power switch, a release (an image-capturing trigger) switch, a zoom operation switch, and an image-capturing mode selection switch. The storage medium 524 stores an image, such as a captured image. The storage medium 524 may be built in the imaging system or may be a removable medium, such as a memory card.

In this way, the imaging system 500 to which the photoelectric conversion apparatus 1000 according to each of the first to fourth embodiments is applied is configured. A high-performance imaging system can be thereby implemented.

Figure 15A:
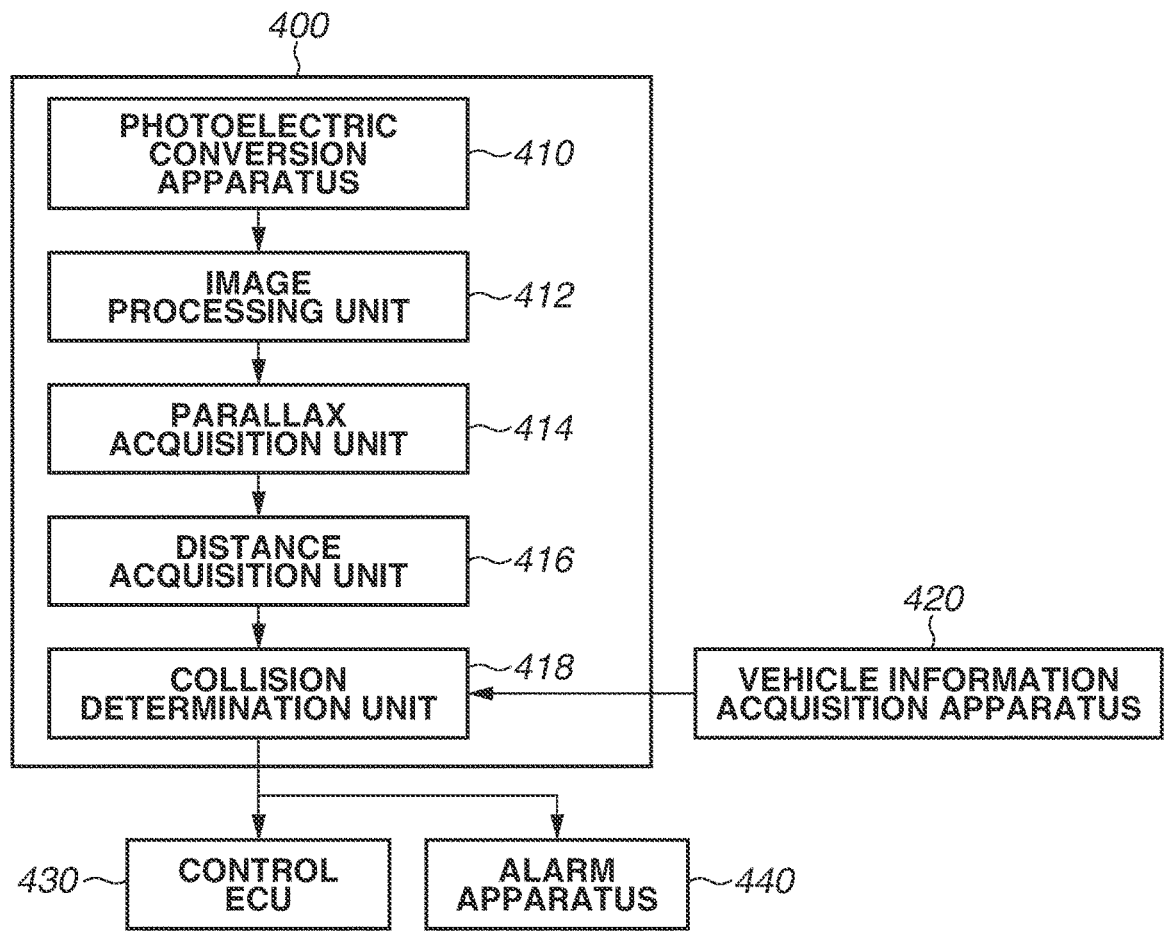
FIGS. 15A and 15B are diagrams illustrating a configuration of a moving body according to a sixth embodiment.
Figure 15B:
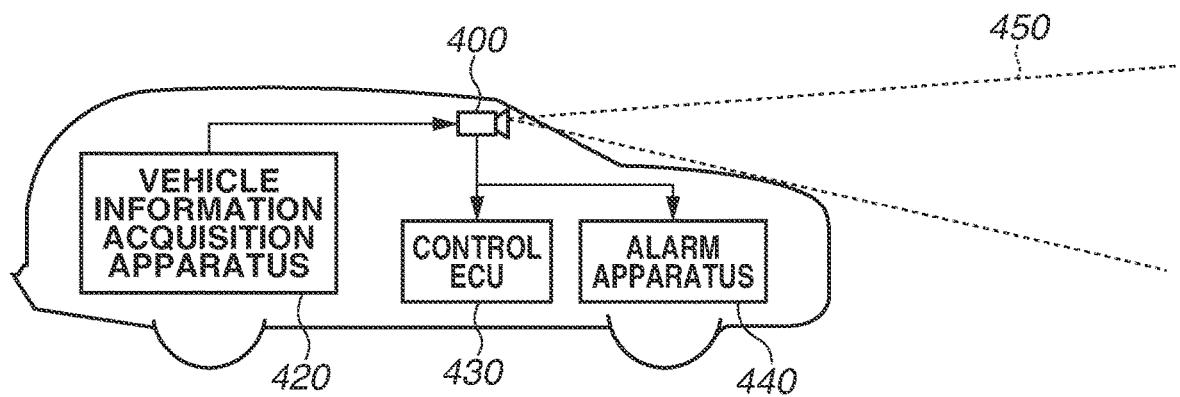

An imaging system and a moving body according to a sixth embodiment of the present invention will be described with reference to FIGS. 15A and 15B. FIGS. 15A and 15B illustrate a configuration of the imaging system and a configuration of the moving body, respectively, according to the present embodiment.

FIG. 15A illustrates an example of an imaging system 400 related to an on-vehicle camera. The imaging system 400 has a photoelectric conversion apparatus 410. The photoelectric conversion apparatus 410 is the photoelectric conversion apparatus according to any one of the above-described first to fourth embodiments. The imaging system 400 has an image processing unit 412. The image processing unit 412 is a processor that performs image processing, for a plurality of pieces of image data acquired by the photoelectric conversion apparatus 410. The imaging system 400 further has a parallax acquisition unit 414. The parallax acquisition unit 414 is a processor that calculates a parallax, from the plurality of pieces of image data acquired by the photoelectric conversion apparatus 410. The imaging system 400 further has a distance acquisition unit 416 and a collision determination unit 418. The distance acquisition unit 416 is a processor that calculates a distance to a target object, based on the calculated parallax. The collision determination unit 418 is a processor that determines whether there is a possibility of collision, based on the calculated distance. Here, the parallax acquisition unit 414 and the distance acquisition unit 416 are provided as an example of an information acquisition unit that acquires information, such as distance information indicating a distance to a target object. In other words, the distance information is information about a parallax, a de-focusing quantity, and a distance to a target object. The collision determination unit 418 may determine a possibility of collision using any one of these pieces of distance information. The above-described various processors may each be implemented by hardware designed for a special purpose, or may be implemented by general-purpose hardware that performs an arithmetic operation based on a software module. The processors may each be implemented by a device, such as a field programmable gate array (FPGA) or an application specific integrated circuit (ASIC), or may be implemented by a combination of these devices.

The imaging system 400 is connected to a vehicle information acquisition apparatus 420, and can acquire vehicle information, such as a vehicle speed, a yaw rate, and a rudder angle. Further, a control electronic control unit (ECU) 430 is connected to the imaging system 400. The control ECU 430 is a controller that outputs a control signal for generating a braking force for a vehicle, based on a result of determination by the collision determination unit 418. In other words, the control ECU 430 is an example of a moving body control unit that controls a moving body based on distance information. The imaging system 400 is also connected to an alarm apparatus 440 that gives an alarm to a driver, based on a result of determination by the collision determination unit 418. For example, in a case where the result of determination by the collision determination unit 418 indicates a high possibility of collision, the control ECU 430 performs vehicle control for avoiding collision or reducing damage by, for example, braking, releasing an accelerator, or suppressing an engine output. The alarm apparatus 440 gives a warning to a user by, for example, generating an audible alarm, displaying alarm information on a screen of a car navigation system, or vibrating a seatbelt or steering.

In the present embodiment, the imaging system 400 images an area around the vehicle, e.g., the front or the rear. FIG. 15B illustrates the imaging system 400 in a case where the front (an imaging area 450) of the vehicle is imaged. The vehicle information acquisition apparatus 420 sends an instruction for causing the imaging system 400 to perform imaging. Using the photoelectric conversion apparatus according to any one of the above-described first to fourth embodiments, as the photoelectric conversion apparatus 410, the imaging system 400 according to the present embodiment can further enhance the accuracy of ranging.

The example in which the control for not colliding with other vehicle is performed is described above. However, the imaging system is also applicable to control, for example, automatic driving control for following other vehicle and automatic driving control for not deviating from a lane. Further, the imaging system is applicable to not only a vehicle, such as an automobile, but also, for example, a moving body (a transport machine) such as a ship, an airplane, or an industrial robot. Examples of a movement apparatus in the moving body (the transport machine) includes any of various movement units such as an engine, a motor, a wheel, and a propeller. In addition, the imaging system is applicable to not only the moving body, but also an apparatus that utilizes object recognition in a wide range, such as an intelligent transport system (ITS).

Each of the above-described embodiments is only a specific example in implementing the present invention, and interpretation of the technical scope of the present invention is not restricted by these embodiments. In other words, the present invention can be implemented in various forms without deviating from the technical ideas or the substantial characteristics thereof.

According to the above-described embodiments of the present invention, it is possible to provide a configuration suitable for a photoelectric conversion apparatus that includes a photoelectric conversion unit for outputting a digital signal and uses a plurality of power supply voltages.

While the present invention has been described with reference to embodiments, it is to be understood that the invention is not limited to the disclosed embodiments. The scope of the following claims is to be accorded the broadest interpretation so as to encompass all such modifications and equivalent structures and functions.

What is claimed is:

1. A photoelectric conversion apparatus comprising:
    a first chip having a first semiconductor substrate on which a diode of avalanche amplification type is disposed and a first wiring layer;
    a second chip having a second semiconductor substrate on which a signal processing circuit that processes a signal based on an output from the diode is disposed and a second wiring layer;
    a first terminal configured to be connectable to a power supply outside of the first and the second chips and providing a second voltage; and
    a second terminal configured to be connectable to a power supply outside of the first and the second chips and providing a fourth voltage,
    wherein the first chip and the second chip are layered,
    wherein the first wiring layer and the second wiring layer are disposed between the first semiconductor substrate and the second semiconductor substrate,
    wherein the diode is supplied with a first voltage and the second voltage,
    wherein the signal processing circuit is supplied with a third voltage and the fourth voltage,
    wherein a difference between the first voltage and the second voltage is greater than a difference between the third voltage and the fourth voltage, and
    wherein the first terminal is disposed in either the first wiring layer or the second wiring layer, and the second terminal is disposed in either the first wiring layer or the second wiring layer.

2. The photoelectric conversion apparatus according to claim 1, wherein the first terminal and the second terminal are provided in a same wiring layer.

3. The photoelectric conversion apparatus according to claim 1, further comprising
    a first connecting portion provided in the first chip, and
    a second connecting portion provided in the second chip,
    wherein the first connecting portion and the second connecting portion are arranged to contact one another at a joint plane between the first chip and the second chip.

4. The photoelectric conversion apparatus according to claim 3,
    wherein at least one of a line that supplies the second voltage and a line that supplies the fourth voltage is disposed to pass through the joint plane.

5. The photoelectric conversion apparatus according to claim 3,
    wherein a first portion disposed adjacent to the first connecting portion and provided on the first chip and a second portion disposed adjacent to the second connecting portion and provided on the second chip are different in material from both of the first connecting portion and the second connecting portion, and wherein the first portion and the second portion are arranged to contact one another at the joint plane.

6. The photoelectric conversion apparatus according to claim 1, wherein the first voltage is a first power supply voltage.

7. The photoelectric conversion apparatus according to claim 1, wherein the second voltage is a second power supply voltage.

8. The photoelectric conversion apparatus according to claim 1, wherein the fourth voltage is a fourth power supply voltage.

9. The photoelectric conversion apparatus according to claim 1, wherein the first voltage is a voltage on anode side of the diode, and the second voltage is a voltage on cathode side of the diode.

10. The photoelectric conversion apparatus according to claim 1, wherein the second voltage is greater than the first voltage, and the fourth voltage is greater than the third voltage.

11. The photoelectric conversion apparatus according to claim 3,
wherein an output node connected to the diode is disposed to pass through the joint plane.

12. The photoelectric conversion apparatus according to claim 1, wherein the signal processing circuit is a counter circuit that counts the number of pulses.

13. The photoelectric conversion apparatus according to claim 3, wherein a line that supplies the first voltage is disposed not to pass through the joint plane.

14. The photoelectric conversion apparatus according to claim 1, wherein the first voltage is a negative voltage.

15. An imaging system comprising:
the photoelectric conversion apparatus according to claim 1; and
a processing apparatus configured to process a signal output from the photoelectric conversion apparatus.

16. A moving body comprising:
the photoelectric conversion apparatus according to claim 1;
a movement apparatus;
a processing apparatus configured to acquire information from a signal output from the photoelectric conversion apparatus; and
a control apparatus configured to control the movement apparatus based on the information.

* * * * *